(12) United States Patent
Dent

(10) Patent No.: US 6,553,229 B1
(45) Date of Patent: Apr. 22, 2003

(54) SIGNAL SCANNING SYSTEMS AND METHODS FOR MULTIPLE-MODE CELLULAR RADIOTELEPHONES

(75) Inventor: Paul Wilkinson Dent, Pittsboro, NC (US)

(73) Assignee: Ericsson Inc., Research Triangle Park, NC (US)

( * ) Notice: Subject to any disclaimer, the term of this patent is extended or adjusted under 35 U.S.C. 154(b) by 12 days.

(21) Appl. No.: 09/672,758

(22) Filed: Sep. 28, 2000

Related U.S. Application Data

(62) Division of application No. 09/198,789, filed on Nov. 24, 1998.

(51) Int. Cl.[7] ................................................. H04Q 4/20
(52) U.S. Cl. ...................... 455/434; 455/454; 455/429; 370/347
(58) Field of Search ................................ 455/425, 436, 455/421, 552, 437, 553, 563, 564, 67.1, 67.2, 266, 188.1, 33.1, 131–132, 139; 370/342, 312, 320–321, 334–335, 318, 319, 337, 465–466, 481, 486–487; 375/267, 299, 347, 349, 356, 200, 295, 316

(56) References Cited

U.S. PATENT DOCUMENTS 5,020,093 A * 5/1991 Pireh .......................... 455/434
5,197,093 A    3/1993 Knuth et al. .................. 379/61

(List continued on next page.)

FOREIGN PATENT DOCUMENTS

EP          0 722 258 A2      7/1996

OTHER PUBLICATIONS

International Search Report, PCT/US 99/24333, Jan. 28, 2000.

(List continued on next page.)

*Primary Examiner*—Daniel Hunter
*Assistant Examiner*—Pablo N Tran
(74) *Attorney, Agent, or Firm*—Myers Bigel Sibley & Sajovec

(57) ABSTRACT

Multiple-mode cellular radiotelephones use a wide bandwidth receiving mode while scanning for signals in a narrow bandwidth receiving mode. Thus, when it is desired to scan the received frequency band to search for the presence of narrowband signals, the wider receiver bandwidth is first selected. When significant signal energy is identified in the wider bandwidth, a further scan using the narrowband mode may then be provided in order to locate the narrow bandwidth channel containing the strongest signal. In another embodiment, the signals that are received in the wider bandwidth mode are digitized to obtain complex signal samples. The complex signal samples are then processed to determine energy in each of a plurality of narrower bandwidths corresponding to channels in the narrower bandwidth cellular radiotelephone standards. Accelerated scanning of TDMA cellular channels may be obtained by tuning the cellular radiotelephone to a succession of frequency channels within one TDMA time slot and measuring signal strength for each of the succession of frequency channels. Tuning and measuring is then repeated for remaining ones of the TDMA time slots in the TDMA frame, preferably using the same channels in the same order. For each frequency channel, the signal strength that is the greatest measured signal strength of the frequency channel in all of the TDMA slots is assigned to that frequency channel. The assigned signal strengths may then be used to select a frequency channel for TDMA signal acquisition. Historical information may also be used to accelerate scanning of cellular channels by a cellular radiotelephone.

15 Claims, 9 Drawing Sheets

U.S. PATENT DOCUMENTS

| | | | | |
|---|---|---|---|---|
| 5,408,684 A | | 4/1995 | Yunoki et al. | 455/34.2 |
| 5,511,235 A | | 4/1996 | Duong et al. | 455/75 |
| 5,517,677 A | | 5/1996 | Moon | 455/161.1 |
| 5,524,280 A | | 6/1996 | Douthitt et al. | 455/62 |
| 5,551,058 A | | 8/1996 | Hutcheson et al. | 455/33.2 |
| 5,574,995 A | * | 11/1996 | Masaski | 455/161.2 |
| 5,613,208 A | | 3/1997 | Blackman et al. | 455/34.1 |
| 5,649,000 A | * | 7/1997 | Lee et al. | 370/331 |
| 5,649,308 A | * | 7/1997 | Andrews | 370/334 |
| 5,668,837 A | | 9/1997 | Dent | 375/316 |
| 5,758,266 A | * | 5/1998 | Kornfeld et al. | 375/267 |
| 5,774,807 A | | 6/1998 | Yazaki et al. | 455/434 |
| 5,778,316 A | | 7/1998 | Persson et al. | 455/434 |
| 5,794,147 A | | 8/1998 | Huang | 455/434 |
| 5,815,525 A | * | 9/1998 | Smith et al. | 375/130 |
| 5,854,808 A | | 12/1998 | Peponides et al. | 375/224 |
| 5,903,838 A | | 5/1999 | Yazaki et al. | 455/434 |
| 5,903,839 A | | 5/1999 | Mattila | 455/434 |
| 5,991,622 A | | 11/1999 | Henry | 455/434 |
| 5,995,834 A | | 11/1999 | Moore | 455/434 |
| 6,047,171 A | * | 4/2000 | Khayrallah et al. | 455/266 |
| 6,075,989 A | * | 6/2000 | Moore et al. | 455/436 |
| 6,108,541 A | | 8/2000 | Yazaki et al. | 455/434 |
| 6,169,733 B1 | * | 1/2001 | Lee | 370/342 |
| 6,192,239 B1 | * | 2/2001 | Lee et al. | 455/421 |

OTHER PUBLICATIONS

U.S. patent application Ser. No. 08/974,227, Gore et al., filed Nov. 19, 1997.

U.S. patent application Ser. No. 09/196,005, Dent, filed Nov. 19, 1998.

* cited by examiner

SIGNAL SCANNING SYSTEMS AND METHODS FOR MULTIPLE-MODE CELLULAR RADIOTELEPHONES

This is a division of application Ser. No. 09/198,789, filed Nov. 24, 1998.

FIELD OF THE INVENTION

This invention relates to cellular radiotelephones and operating methods therefor, and more particularly to channel acquisition for cellular radiotelephones.

BACKGROUND OF THE INVENTION

Cellular radiotelephones are widely used for wireless mobile communications of voice and/or data. As used herein, the term "cellular radiotelephone" encompasses a wide variety of portable radiotelephone devices that access a cellular radiotelephone system. Cellular radiotelephones include portable telephones of the handheld or bag phone variety and permanently mounted car cellular telephones. The term "cellular radiotelephone" also includes wireless terminals that provide functions in addition to those of the cellular telephone, such as facsimile, data communications, data processing, word processing applications and other functions. Added function cellular radiotelephones are often referred to as "Personal Communications Systems" (PCS).

When a cellular radiotelephone is powered on, it performs an initialization procedure with the cellular radiotelephone system. In general, the cellular radiotelephone scans a plurality of channels and/or time slots in order to locate an appropriate control channel. Cellular radiotelephones that operate in the U.S. AMPS system may only need to scan a limited number of channels at power-up in order to locate a broadcast control channel. Broadcast control channels generally are confined to a small portion of the available spectrum about 1 MHz wide in order to reduce scan time. Moreover, since in AMPS the broadcast control channel transmissions generally are continuous transmissions, the receiver could alight on a scanned channel at any time and make a measurement. In analog cellular telephones it is known to scan channels in sequential order to minimize the frequency changing time from one channel to the next.

A current trend is to utilize digital transmission for speech and/or data traffic. A number of digital cellular standards are in use that are based on Time Division Multiple Access (TDMA). TDMA systems include the IS136 (D-AMPS) system and the GSM system, also known as DCS 1800 when used in the 1800MHz band and as PCS1900 when used in the U.S. 1900MHz PCS bands. Ongoing development of TDMA standards continues to make improvements in service and product utility, such as longer battery life. One feature introduced into the D-AMPS system, for example, is the Digital Control Channel (DCC) which can reduce the standby battery consumption of cellular radiotelephones that are camped on the DCC to await calls. Unlike the AMPS broadcast control channel, the DCC need not be a continuous carrier signal, but occupies only one slot of the 3-slot TDMA frame. The other two slots can contain traffic, but may be empty during periods of low demand. A major concern with such TDMA systems is the continued reduction in the time that is needed to scan the TDMA cellular channels to identify a channel containing at least one TDMA burst transmission.

U.S. Pat. No. 5,197,093, to Knuth et al., describes a cordless telephone which has an improved mechanism for scanning and selecting channels by adapting to the channel usage patterns of the local environment in which it is placed. This results in a prioritized list of channels that have the highest probability of being available, free from interference. By prescanning the channels during the idle time of the cordless telephone, power usage of the handset is minimized and quick acquisition of an available channel becomes possible. However, Knuth is not concerned with identifying a broadcast control channel of a cellular system by finding channels containing the strongest signal, but rather is concerned with finding channels which contain the minimum of interference, i.e. the minimum signal strength.

U.S. Pat. No. 5,511,235 to Duong et al., describes a receiver which has a channel scan mode of operation and a communication mode of operation. In the channel scan mode of operation, the passband of a filter is narrowed relative to the passband of the filter in the communication mode.

U.S. Pat. No. 5,524,280 to Douthitt et al., describes a method of scanning channels that includes fast scanning a predetermined list of data channels to identify a fast scanned channel; intermediate scanning, when the fast scanned channel is not identified, the predetermined list of channels to identify an intermediate scanned channel where a channel from the predetermined list of channels is evaluated for a first time period; and slow scanning, when the intermediate scanned channel is not identified, the predetermined list of channels is scanned to identify a slow scanned channel where a channel from the predetermined list of channels is evaluated for a second time period.

U.S. Pat. No. 5,574,995 to Masaki describes a controller that shifts the frequency of the local oscillator with a frequency shift circuit so that as many channels to be scanned as possible will be included within specified bandwidths, detects a desired received signal by scanning each of the specified bandwidths with the shifted frequency, scans each channel within the bandwidth where the desired received signal was detected, and changes the frequency of the local oscillator or shifts the frequency of the local oscillator with the frequency shift circuit so that the desired channel frequency identified above will be at the center of said bandwidth. However, Masaki is apparently not concerned with being able to decode a detected signal in the presence of an adjacent channel signal, as is the case in cellular systems. Rather, Masaki appears to be concerned with detecting a signal in a sparsely populated part of the spectrum where adjacent channel discrimination may not be needed, and of identifying the frequency channelisation raster on which a detected signal is allocated. Masaki adapts the receiver to the identified channelisation raster so that a detected signal is centrally placed in the receiver bandwidth, while avoiding the need for a plurality of receiver bandwidths adapted to different channelisation rasters.

Multiple-mode cellular radiotelephones such as dual-mode cellular radiotelephones are also widely used in cellular radiotelephone communications. For example, dual-mode cellular radiotelephones may operate both in narrowband FM mode and in wideband CDMA mode. Alternatively, dual-mode cellular radiotelephones may also operate in a narrowband cellular standard mode such as AMPS or D-AMPS (IS136) as well as a wider bandwidth standard such as GSM (known in the U.S. as PCS 1900) or IS95. The narrowband standard may use a receive channel spacing of 30 kHz while the GSM/PCS 1900 standard may use 200 kHz channel spacing.

Dual-mode cellular radiotelephones generally are adapted in bandwidth to operate in different channelisation rasters, for example a 200kHz raster for GSM operation and a 30 kHz raster for D-AMPS operation. Moreover, receiver bandwidths of dual-mode cellular radiotelephones are generally narrower than the channel spacing for which they are intended, for example 20% less than the channel spacing. This contrasts with Masaki, in which the receiver bandwidth is wider than the expected channel spacing.

Accordingly, there continues to be a need for cellular radiotelephones and methods that can efficiently acquire a channel. There is a particular need for improved channel acquisition in multiple-mode cellular radiotelephones.

SUMMARY OF THE INVENTION

It is therefore an object of the present invention to provide improved cellular radiotelephones and scanning systems and methods therefor.

It is another object of the present invention to provide improved multiple-mode cellular radiotelephones and scanning systems and methods therefor.

These and other objects are provided in multiple-mode cellular radiotelephones by using a wide bandwidth receiving mode while scanning for signals in a narrow bandwidth receiving mode. Thus, when it is desired to scan the received frequency band to search for the presence of narrowband signals, the wider receiver bandwidth is first selected. When significant signal energy is identified in the wider bandwidth, a further scan using the narrowband mode may then be provided in order to locate the narrow bandwidth channel containing the strongest signal.

More specifically, according to this aspect of the present invention, a multiple-mode cellular radiotelephone conforms to at least two cellular radiotelephone standards of different signal bandwidths. The multiple-mode cellular radiotelephone includes a selector that selects a receiver bandwidth conforming to a wider one of the at least two cellular radiotelephones standards of different signal bandwidths while searching for control channels that conform to a narrower one of the at least two cellular radiotelephone standards of different signal bandwidths relative to the wider one of the at least two cellular radiotelephone standards of different signal bandwidths. The control channels that conform to the narrower bandwidth standard are searched by controlling a receiver to tune to a sequence of channel frequencies in the wider one of the at least two cellular radiotelephone standards of different signal bandwidths. Signal measurements are made on the sequence of channel frequencies and the signal measurements are all processed to select at least one channel frequency from the sequence of channel frequencies. The narrower receiver bandwidth is then selected and the at least one channel frequency is scanned in the narrower bandwidth, for example, to determine the narrower bandwidth channel having the largest signal strength. In another embodiment, the signals that are received in the wider bandwidth mode are digitized to obtain complex signal samples. The complex signal samples are then processed to determine energy in each of a plurality of narrower bandwidths corresponding to channels in the narrower bandwidth cellular radiotelephone standards. Accordingly, accelerated scanning of cellular channels in a narrower bandwidth mode may be obtained.

According to another aspect of the present invention, accelerated scanning of TDMA cellular channels may be obtained by tuning the cellular radiotelephone to a succession of frequency channels within one TDMA time slot and measuring signal strength for each of the succession of frequency channels. Tuning and measuring is then repeated for remaining ones of the TDMA time slots in the TDMA frame, preferably using the same channels in the same order. For each frequency channel, the signal strength that is the greatest measured signal strength of the frequency channel in all of the TDMA slots is assigned to that frequency channel. The assigned signal strengths may then be used to select a frequency channel for TDMA signal acquisition.

Historical information may also be used to accelerate scanning of cellular channels by a cellular radiotelephone. In particular, a control channel may be identified from among a plurality of candidate control channels that are transmitted by a cellular radiotelephone network by providing in the cellular radiotelephone, initial probability indications for each of the candidate control channels. The initial probability indications indicate a probability that the associated control channel includes a predetermined type of control channel signal, before the plurality of candidate control channels are received. The cellular radiotelephone is then tuned to a selected one of the candidate control channels. A signal is received on the selected one of the candidate control channels. The initial probability indication is updated for the selected one of the candidate control channels based upon the received signal, to provide an updated probability indication for the selected one of the candidate control channels.

Tuning, receiving and updating are performed for remaining ones of the candidate control channels until one of the updated probability indications for a corresponding one of the candidate control channels exceeds a threshold. The corresponding one of the candidate control channels is then attempted to be decoded. If the corresponding one of the candidate control channels is successfully decoded, the initial probability indication for the successfully decoded candidate control channel is further updated.

It will be understood that the above described aspects of the invention may be used in combination, Accelerated scanning of cellular channels by cellular radiotelephones is thereby provided.

DETAILED DESCRIPTION OF THE PREFERRED EMBODIMENTS

Figure 1:
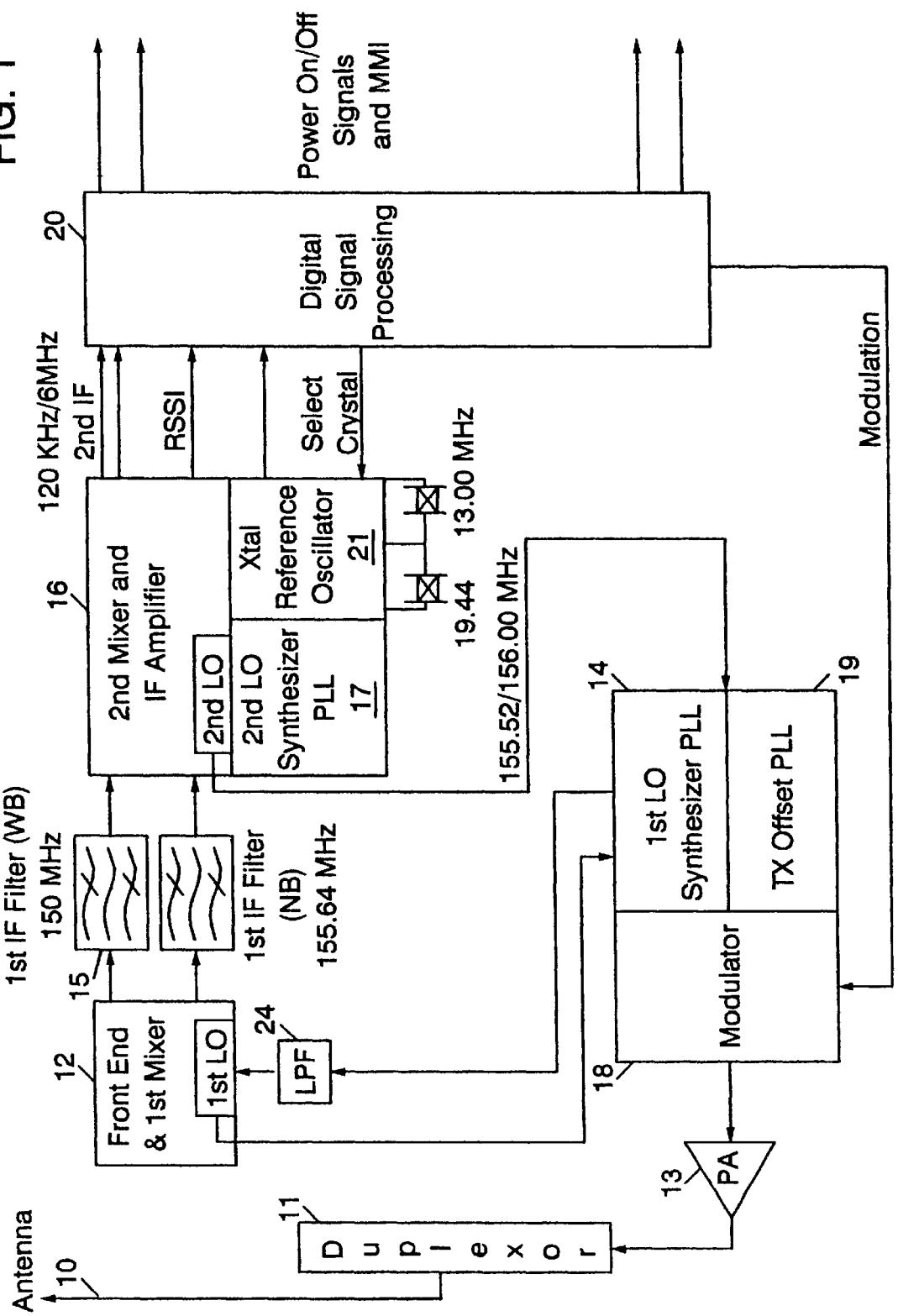
FIGS. 1–4 and 6 are block diagrams of cellular radiotelephones that can be used to provide accelerated scanning according to the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

In one aspect of the invention, a digital cellular radiotelephone scans a large number of cellular channels to detect a channel containing at least one TDMA burst transmission. Such a burst transmission, when conforming to the U.S. TDMA standard IS136, comprises a burst of 6.6 mS duration repeating in a 20 mS TDMA frame period. The other 13.3 mS of the frame period may be silent. It will be understood that TDMA signals are transmitted as a repeating TDMA frame that comprises a plurality of TDMA time slots.

The channel should be scanned when the burst transmission is present. Conventionally, this meant dwelling on each channel for the whole 20 mS to guarantee that the burst would be detected, increasing the time to scan typically 800 channels to 16 seconds. According to the invention, each of between typically 2 and 13 channels may be dwelled on for typically 0.5 mS, making a signal strength measurement on each during a 6.6 mS period. Then, the same channels are scanned again, preferably in the same order, during the next 6.6 mS period and yet again in a third 6.6 mS period. The largest of the three signal strength measurements made for each channel is then determined and retained, for example in a table entry, for each channel. Thus, whichever one of the 6.6 mS TDMA slots contains a signal, the receiver will make at least one measurement of that signal. Compared to conventional techniques, this scanning may be faster by up to 13 times, and may reduce the scan time to scan the whole band from 16 seconds to less than two seconds.

Signal acquisition can then proceed by prioritizing the channels according to signal strength and optionally historical information, and tuning in turn to the channels in order of priority to attempt to decode a signal. Optionally, the three signal measurements made on each channel can be further analyzed to indicate the likelihood that the channel contains a TDMA signal with one active slot, two active slots, three active slots or an AMPS signal. The latter, that is three active slots or an AMPS control channel, can be given priority for decoding attempts, if desired.

Another aspect of the invention relates to multiple-mode, cellular radiotelephones such as dual-band cellular radiotelephones that comply with a narrowband cellular standard, such as AMPS or D-AMPS (IS136), as well as a wider bandwidth standard such as the European GSM standard (known in the U.S. as PCS1900) or the U.S. CDMA standard IS95. The narrowband standard uses a receive channel spacing of 30 kHz, while the GSM/PCS1900 standard uses 200 kHz channel spacing. Typically, the receiver bandwidth is about 20% less than the channel spacing.

According to this aspect, when it is desired to scan the receive frequency band to search for the presence of narrowband signals, the wider receiver bandwidth is selected. The receive band is then scanned in larger increments than 30 kHz, for example 150 kHz in the GSM/PCS 1900 case or in 600 kHz increments in the IS95 case. This can enable the scan to be completed in one fifth of the time, using 150 kHz steps, compared to using 30 kHz steps. Moreover, up to 13 channels may be scanned per 20 mS as was previously described, thus allowing an increase in the scan rate to 13×150 kHz per 20 mS, or less than 0.4 seconds to scan the whole 25MHz of the 800MHz receive band and less than 2 seconds to scan the whole 60MHz of the 1900MHz PCS bands. Receiver tuning time may be reduced by scanning groups of adjacent channels at a time to reduce frequency synthesizer settling time.

When significant signal energy is identified in the larger bandwidth, a further scan using the narrowband filter may then be instituted to precisely locate the 30 kHz channel containing the strongest signal. For example, those 150 kHz segments scanned using a PCS1900 receiver bandwidth are prioritized according to signal strength and optionally historical information, and then scanned again in order of priority in five steps of 30 kHz, taking an additional 20 mS using the technique described above. When the existence of a signal has been narrowed down to a specific 30 kHz channel, an attempt is then made to decode an AMPS control channel in the 800MHz receive band, alternatively a D-AMPS digital control channel in the 1900MHz receive band.

Use of historical information to prioritize channel searching can include memorizing the channels on which valid signals were detected most recently, memorizing a signal strength threshold below which a valid signal has never been detected on a channel, and/or memorizing a signal strength threshold above which a valid signal has always or usually been detected. Other historical information may be used.

U.S. patent application Ser. No. 08/974,227 to Gore, Dolman and the present inventor Dent entitled *Simplified Reference Frequency Distribution In A Mobile Phone*, assigned to the assignee of the present invention, the disclosure of which is hereby incorporated by reference herein in its entirety, describes a mobile radiotelephone having a simplified architecture including a reduced number of integrated circuits and a reduced number of radio frequency connections. A dualband, dual-mode mobile phone can be constructed using either a single crystal reference oscillator or two crystals such that alternative symbol rates, channel spacings, or transmit/receive duplex spacings can be achieved. The present invention can control which bandwidth is used when searching for channels, which may be hardware and/or software implemented in a multiple-mode cellular radiotelephone such as described in the above-referenced application Ser. No. 08/974,227.

U.S. patent application Ser. No. 09/196,005 to the present inventor Dent, filed Nov. 19, 1998. entitled *Cellular Communication Device with Scanning Receiver and Continuous Mobile Communication System Employing Same*, assigned to the assignee of the present invention, the disclosure of which is hereby incorporated herein by reference in its entirety, describes a cellular radiotelephone having a separate wideband digitizing channel and a narrowband communications receiver in which the wideband digitizing receiver takes a short sample of the entire bandwidth, digitizes it to produce numerical samples, and processes the numerical samples using a Fast Fourier Transform (FFT) to perform digital channelisation, thereby measuring energy in all channels in the parallel manner. Some of the principles of this application may be also be used in the present application. It will be understood, however, that although the invention will be described with reference to the above two co-pending applications, it may be incorporated into any cellular radiotelephone, preferably a multiple-mode cellular radiotelephone that receives TDMA signals.

Referring now to FIG. 1, a reproduction of FIG. 12 of the above described application Ser. No. 08/974,227 is provided. A dual-bandwidth cellular radiotelephone according to FIG. 1 comprises a front-end for receiving signals at a radio frequency and converting them to an Intermediate Frequency (IF) using heterodyne mixing with a local oscillator signal controlled by synthesizer 14. IF signals are filtered either using wideband filter 15 WB or alternatively narrowband filter 15 NB. Further amplification and frequency conversion takes place in IF chip 16 and then the final IF signal is digitized and processed within digital signal processing unit 20 using for example a logpolar digitizer as described in U.S. Pat. No. 5,048,059 to the present inventor. The digital signal processing unit 20 is also able to control whether the wideband or narrowband filtered signal is processed by control lines (not shown) to any or all of front end 12, IF chip 16 and synthesizer 14. An antenna 10, duplexor 11, power amplifier 13, second phase locked loop 17, modulator 18, transmit offset phase locked loop 19, crystal reference oscillator 21 and low/pass filter 24 are also provided, as described in detail in application Ser. No. 08/974,227.

Figure 2:
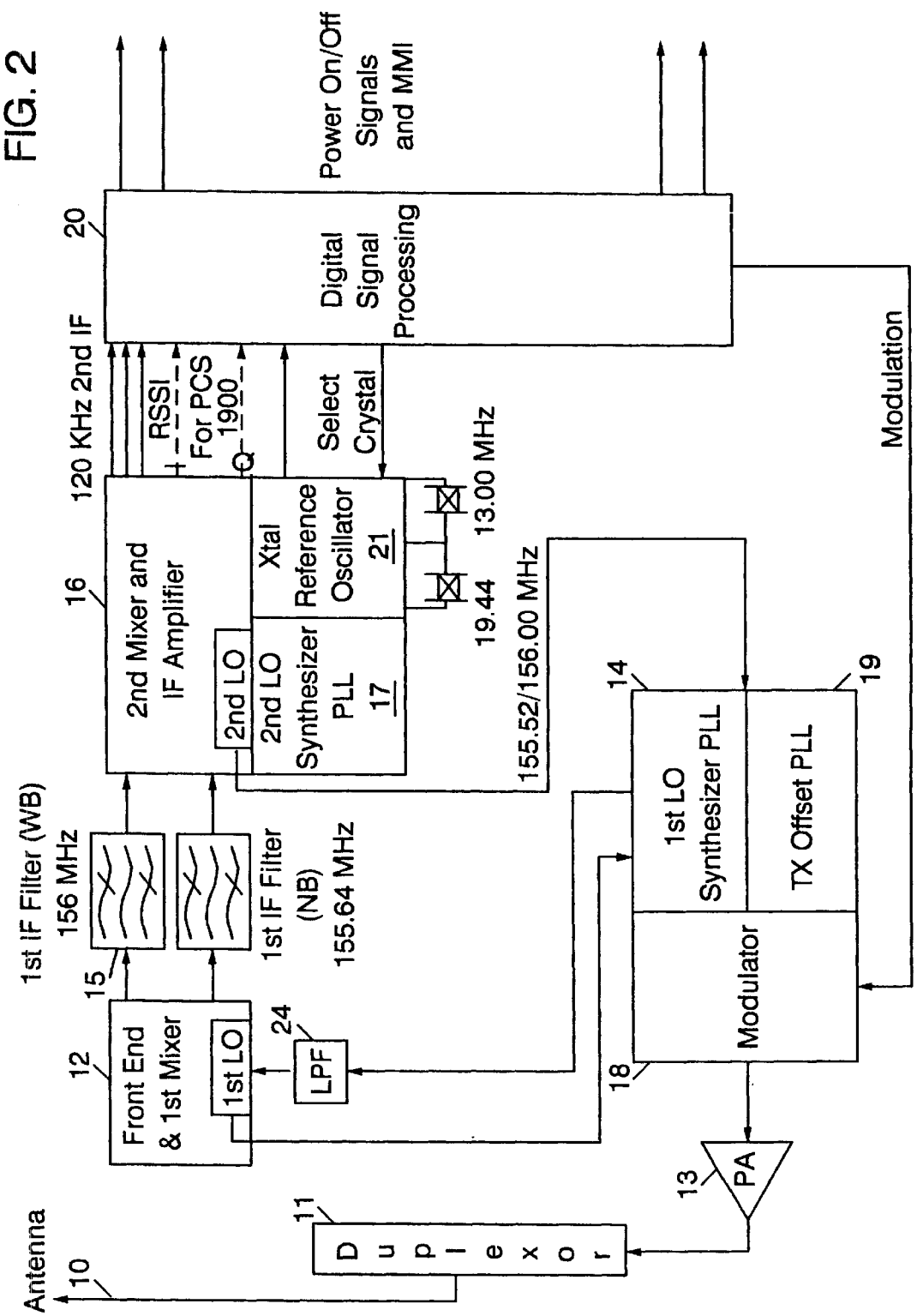

FIG. 2 is similar to FIG. 1, but the wideband digitization is performed using a Cartesian or I/Q downconvertor and AtoD conversion. FIG. 2 corresponds to FIG. 4 of the above cited application Ser. No. 08/974,227 and will not be described further here.

Figure 3:
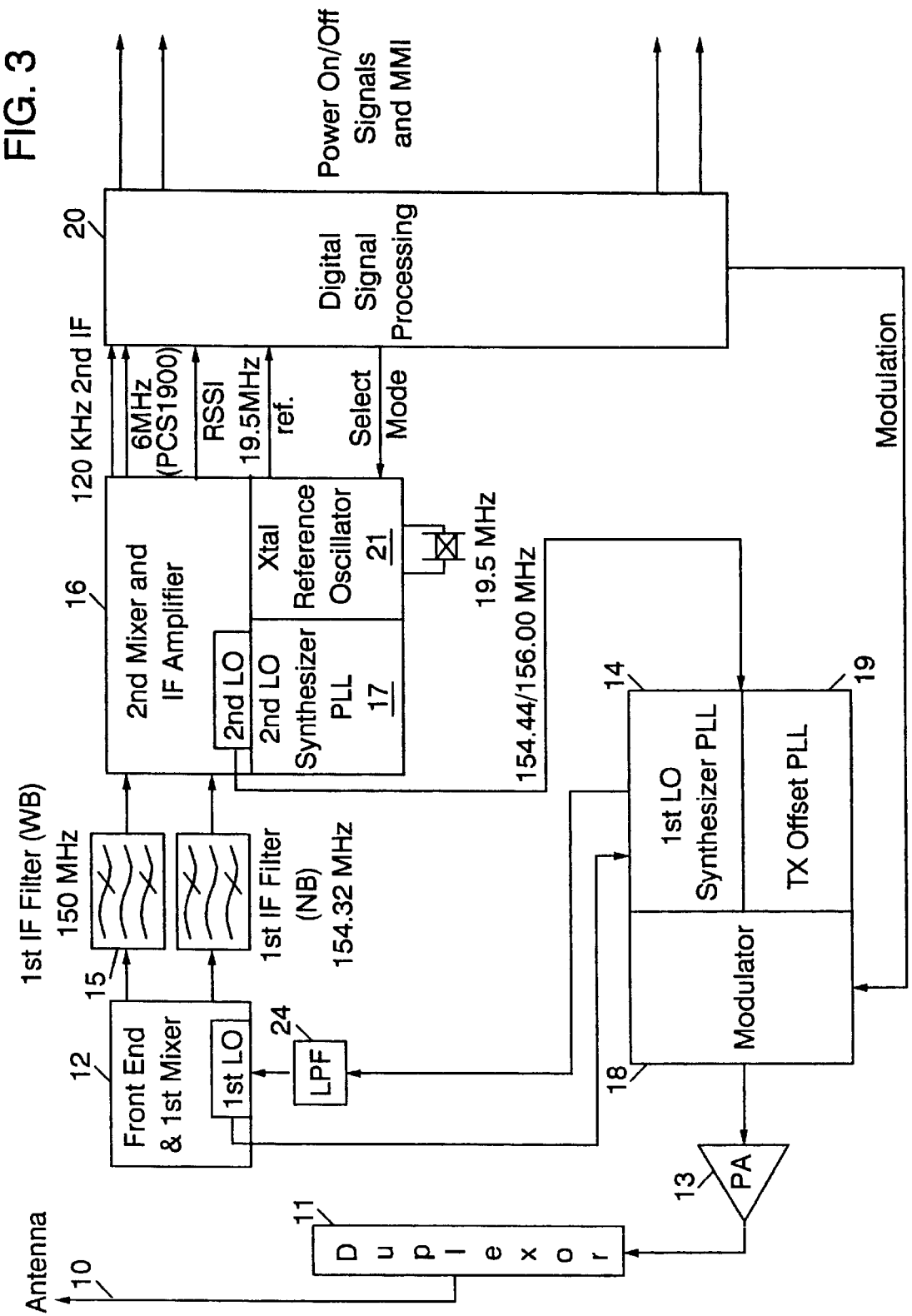

FIG. 3 corresponds to FIG. 15 of the above cited application Ser. No. 08/974,227 and shows a dual-mode, dual bandwidth cellular radiotelephone using only a single crystal. A "select mode" control line from the digital signal processor 20 to the IF chip 16 determines whether the wideband filtered IF signal or the narrowband-filtered signal is processed.

Figure 4:
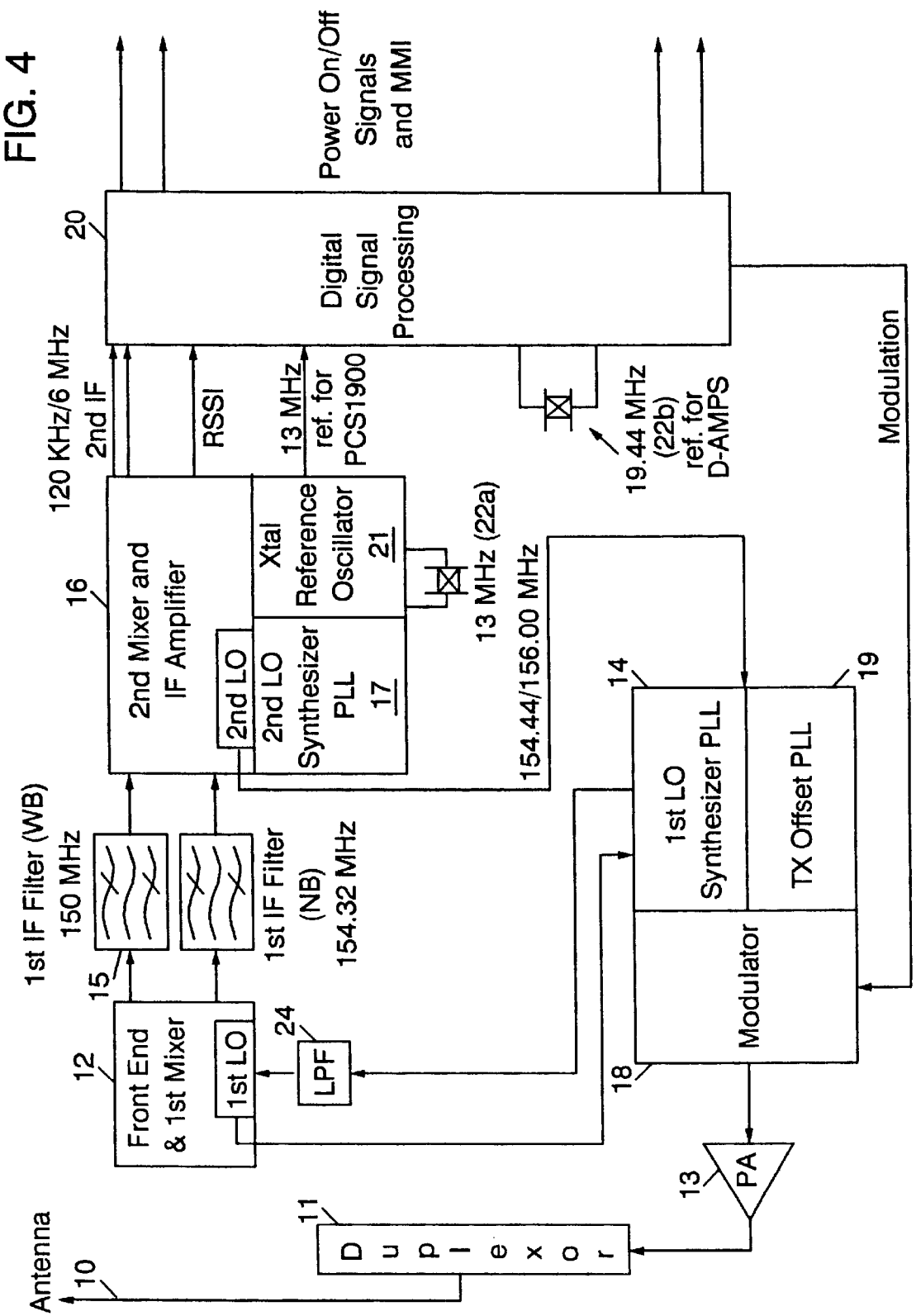
Figure 5A:
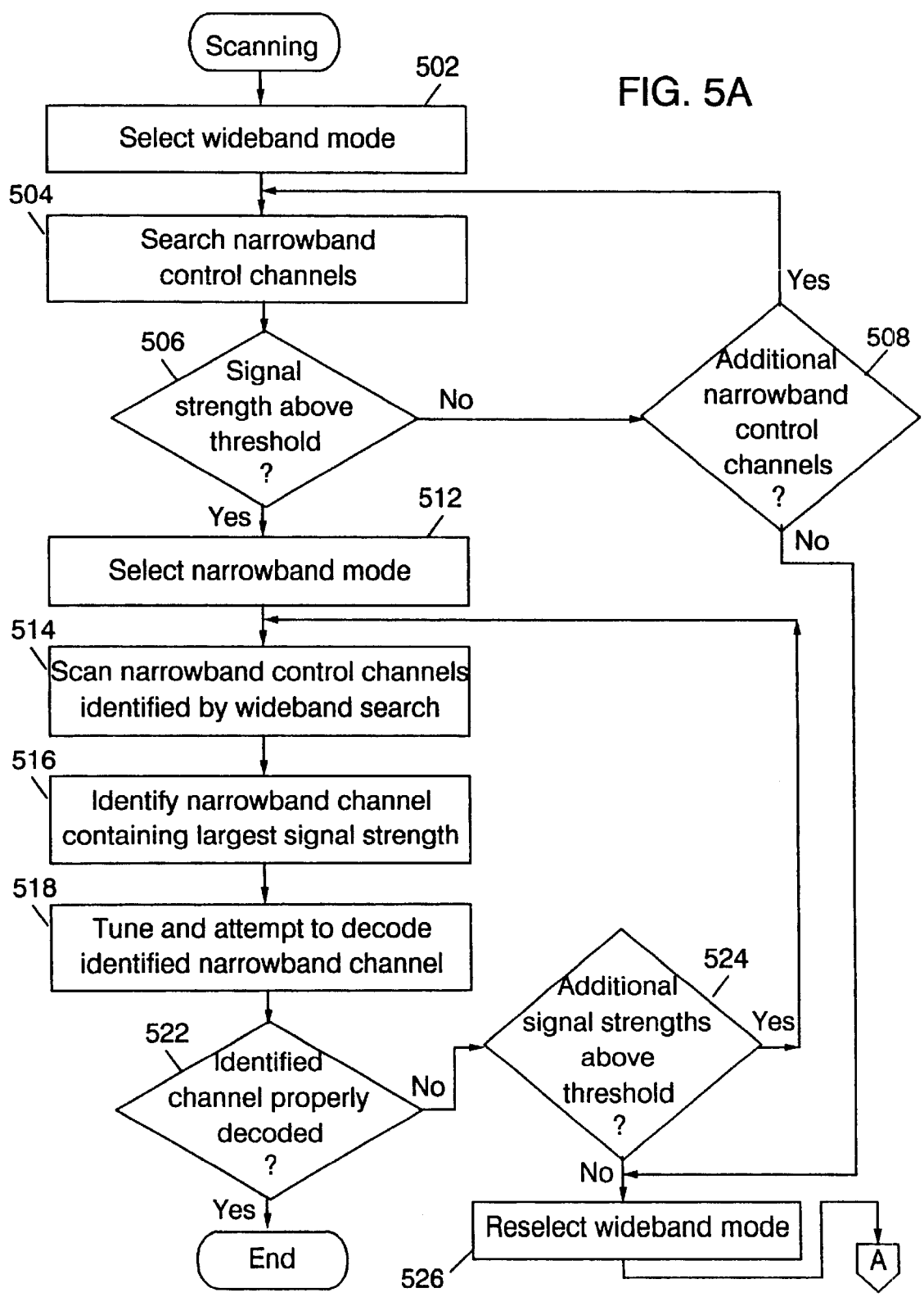
FIG. 5, comprising FIGS. 5A–5D placed together as indicated, is a flowchart illustrating accelerated scanning according to the present invention.
Figure 5B:
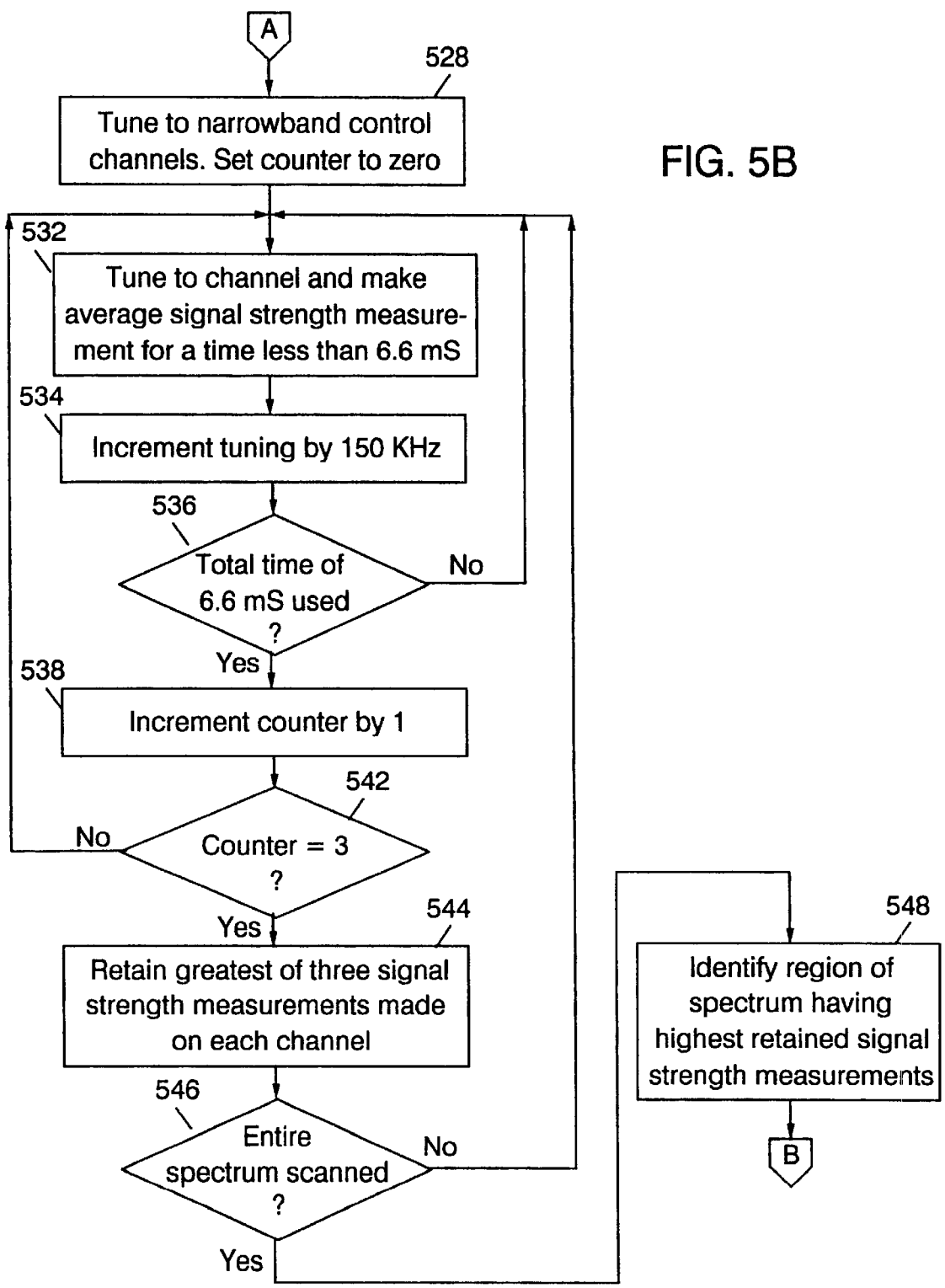
Figure 5C:
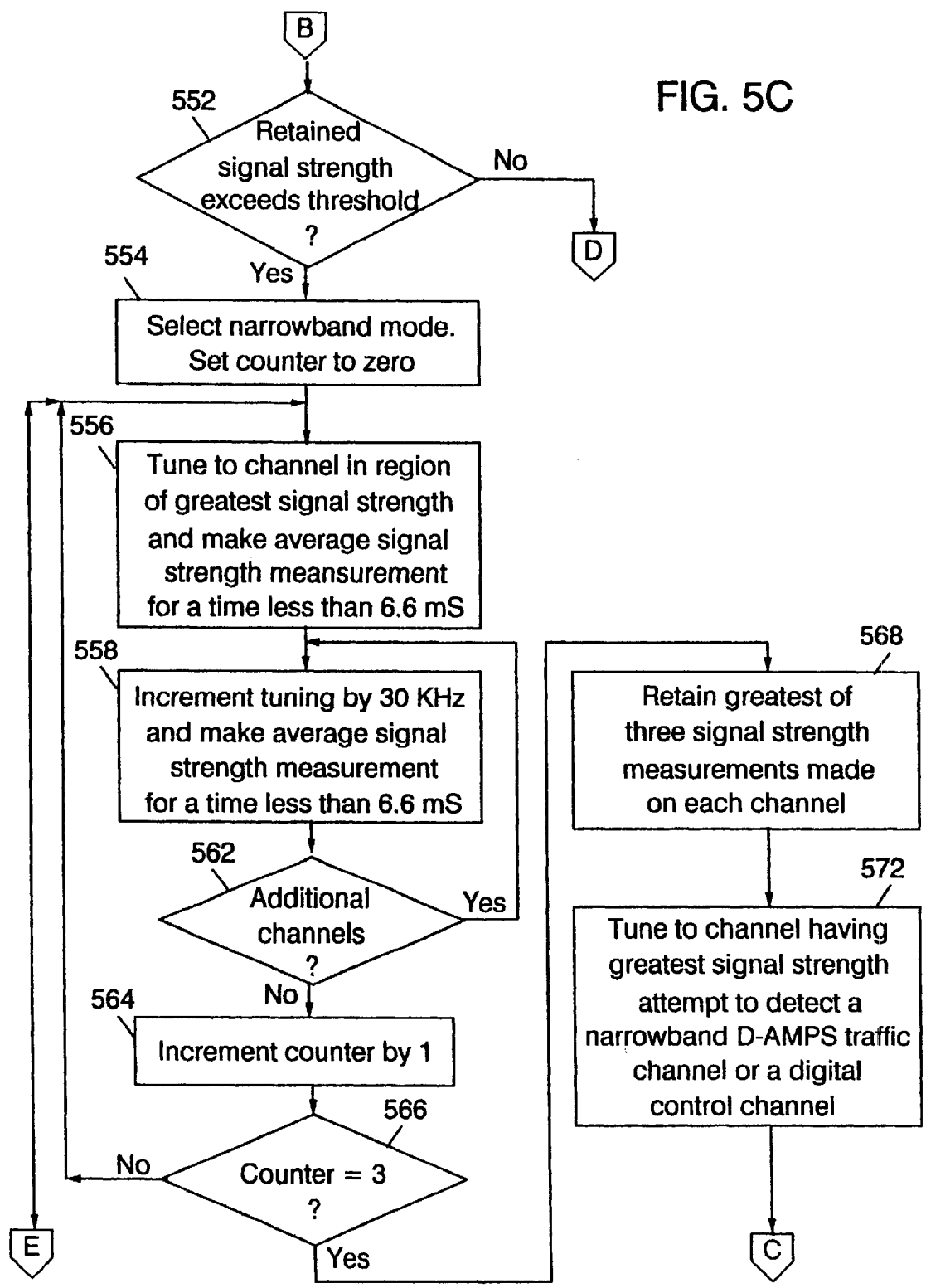
Figure 5D:
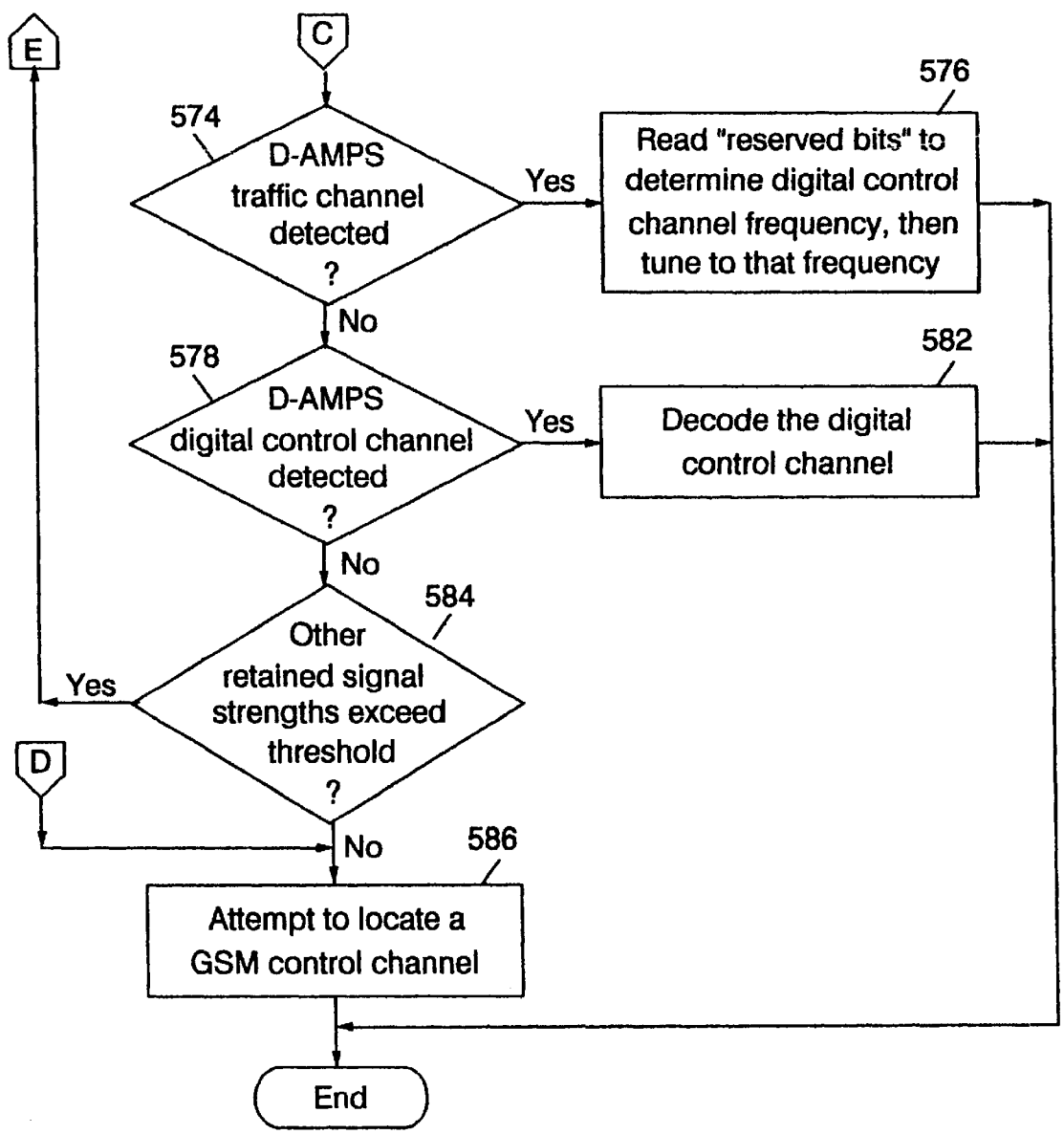

FIG. 4 corresponds to FIG. 17 of the above cited application Ser. No. 08/974,227. FIG. 4 is similar to FIG. 3, but uses a single crystal 22a to derive all radio frequencies and channel spacings while providing an alternative crystal 22b to generate alternative sampling rates in the narrowband D-AMPS mode. All of the cellular radiotelephones of FIGS. 1–4 can also employ dual-band front-ends which permit operation in the 800MHz or 900MHz U.S. or European cellular bands as well as the 1800MHz or 1900MHz European or U.S. PCS bands. Digital signal processing unit 20 can comprise dedicated signal processing logic such as equalizers, programmable DSPs for performing operations such as Fast Fourier Transforms, general purpose microprocessors for controlling timing and flow of operations, and combinations thereof.

A dual-bandwidth receiver according to any of FIGS. 1–4 can have at least two advantages for scanning narrowband channels compared to a receiver having only a narrow bandwidth adapted to that narrow channel spacing. First, the wider bandwidth mode (approximately 150 kHz bandwidth in GSM mode) encompasses five AMPS or D-AMPS 30 kHz-spaced channels at a time. Therefore, identification of signal energy implies that at least one of the five channels contains a signal. Thus, the area of the spectrum containing the strongest signal can be narrowed down to those five channels approximately five times as quickly as scanning in 30 kHz steps.

A second advantage is that the frequency synthesizer used to tune the receiver in steps of 30 kHz, alternatively 200kHz, generally can switch frequencies much faster than a synthesizer designed for only 30 kHz steps. Typically, the frequency switching time is only 0.5 mS compared to 2mS for 30 kHz steps. This may be partly due to the fact that settling is not required to the same accuracy for just placing a signal within the 150 kHz bandwidth as compared to a narrower bandwidth.

FIG. 5, comprising FIGS. 5A–5D placed together as indicated, is a flowchart illustrating an embodiment of scanning to locate AMPS or D-AMPS channels using a dual-mode cellular radiotelephone according to the invention. As will be appreciated by one of skill in the art, the present invention may take the form of an entirely hardware embodiment, an entirely software embodiment or an embodiment combining software and hardware aspects. It will also be understood that each block of the flowchart illustrations, and combinations of blocks in the flowchart illustrations, support combinations of means for performing the specified functions and combinations of steps for performing the specified functions. It will also be understood that each block of the flowchart illustrations, and combinations of blocks in the flowchart illustrations, can be implemented by special purpose hardware-based computer systems which perform the specified functions or steps, or by combinations of special purpose hardware and computer instructions.

Referring now to FIG. 5, a scanning strategy to locate narrowband AMPS or D-AMPS channels using a dual-mode cellular radiotelephone begins by selecting the wideband (GSM) receiver mode at Block 502. At Block 504, the receiver is tuned to the region of the spectrum containing AMPS control channels and the receiver is steptuned in steps of, for example 150 kHz, dwelling on each channel for a signal-strength averaging time and recording the average signal strength measured. At Block 506 a test is made as to whether any measured average signal strength exceeds a predetermined threshold. If yes, then at Block 512 narrowband AMPS mode is selected. At Block 514, the receiver is tuned to the first of the 30 kHz channel steps located within the region of the highest average signal strength identified in Block 506 and then to sequential 30 kHz channels in that region, measuring the average signal strength in each 30 kHz channel using the AMPS receiver bandwidth. At Block 516, the AMPS channel containing the largest signal strength is identified. At Block 518, the receiver is tuned to that channel and an attempt is made to decode an analog control channel.

At Block 522, if no analog control channel is properly decoded, then a determination is made as to whether additional signal strengths above threshold are present at Block 524. If yes, then Blocks 514–522 are repeated using the AMPS receiver bandwidth for all regions identified in the wideband scan of Block 504 with signal strengths over the predetermined threshold in Block 506, until an AMPS control channel is found at Block 522.

Continuing with the description of FIG. 5, if no region contains a signal over the predetermined threshold at Block 524 or no additional analog control channels can be found at Block 508, then at Block 526 the wideband (GSM) mode is reselected and at Block 528 the receiver is tuned to the region of the spectrum in which the AMPS digital control channels or D-AMPS traffic channels may be located. A counter is set to zero.

At Block 532, the receiver is turned to a channel and an average signal strength measurement is made over a period of less than 6.6 mS. At Block 534, tuning is incremented to sequential channels, for example by incrementing in 150 kHz steps. If a total time of 6.6 mS is not used at Block 536, then average signal strength measurements are again performed at Block 532. Once a total time of 6.6 mS has been used at Block 536, the counter is incremented by one at Block 538. Assuming three passes have not been performed at Block 542, additional passes are made until three full passes have been made for a total time of 20 mS used. It will be understood in each of the passes, the same channels are preferably measured in the same order.

At Block 544, the greatest of the three signal strength measurements made on each channel in Blocks 532–542 are retained. Then, Blocks 532–544 are repeated using other channels until the whole region of the D-AMPS spectrum has been scanned. Once the whole region of the D-AMPS spectrum has been scanned at Block 546, then at Block 548, the region of the D-AMPS spectrum containing the highest retained signal strength measurements is identified. At Block 552, a test is made as the whether any of the retained signal strengths is greater than the predetermined threshold. If so, then at Block 554 narrowband D-AMPS mode is selected and a counter is set to zero. At Block 556 the receiver is tuned to the first 30 kHz channel in the region of greatest signal strength identified in Block 548, and a signal strength measurement is made for a period of less than 6.6 mS. At Block 558, the receiver is sequentially tuned to upper channels of the five narrowband channels encompassed in a 150 kHz region, and signal strength measurements are made on each, all within the 6.6 mS, at Block 558, until all the channels have been measured at Block 562. The counter is incremented by one at Block 564. Assuming three passes have not been made at Block 566, a second and third pass of Blocks 556–564 are made. As before, each pass preferably uses the same channels in the same order.

Then at Block 568, the greatest of the three signal strength measurements made in Blocks 556–566 is retained for each channel. At Block 572 the receiver is tuned to the channel containing the greatest signal strength, and an attempt is made to detect a D-AMPS traffic signal or a Digital Control Channel (DCC).

At Block 574, if a D-AMPS traffic channel is detected, then at Block 576 the "reserved bits" are read to determine the frequency of the DCC and then that frequency is tuned. If a D-AMPS traffic channel was not detected at Block 574 then a test is made as to whether a D-AMPS digital control channel was detected at Block 578. If yes, at Block 582 the digital control channel is decoded. If not, then a test is made of Block 584 as to whether other retained signal strengths in Block 568 exceed the predetermined threshold. If yes, then the operations of Blocks 556–584 are repeated until all of the retained signal strengths that exceed the threshold are tested. If no digital control channel is located as a result of the processing of Blocks 556–584, then at Block 586, an attempt is made to locate a GSM control channel.

In Block 586, GSM control channels contain bursts of narrowband energy called the Frequency Control Bursts (FCB) which may be more easily identified using a narrow bandwidth approximately of the order of the AMPS receiver bandwidth. Therefore, it can be useful to select the narrow D-AMPS bandwidth for locating wideband GSM control channels. Conversely, as described in the above steps, it is beneficial to select the wide GSM bandwidth to help locate narrowband AMPS or D-AMPS channels.

It will be understood that FIG. 5 assumed an order of priority for locating control channels of (i) AMPS, (ii) D-AMPS and (iii) GSM. However this order can be varied, for example based on the type of subscription the subscriber has with a cellular service provider. The cellular radiotelephone may first attempt to locate a control channel of the type of system employed by the chosen service provider, a so-called "preferred system". The definition of preferred systems may be programmed into a smart-card provided by the cellular operator or alternatively may be selected by the user using the keyboard and display from a preprogrammed menu of options.

Moreover, it is not necessary to complete the entire search for one type of system before attempting to locate another type of system. For example, if a 150 kHz region of high signal strength in the 1900MHz band proves not to contain a D-AMPS signal, it can be reasonably assumed to contain a GSM signal. That hypothesis can be tested before testing other 150 kHz regions for D-AMPS signals. In general, the order for searching for different systems can be varied using historical information, and the order in which channels are searched for a single type of system can be prioritized using historical information. Such information can include, for example, that the phone has most often locked to a D-AMPS control channel on a first list of frequencies, an AMPS control channel on a second list frequencies, and/or a GSM control channel on a third list of frequencies. How often each frequency was selected in the past can be stored, and those frequencies can be scanned first, in order of probability. A signal strength above which successful acquisition of the signal was previously noted can also be stored. If, upon scanning, such a signal strength is exceeded, an attempt to read the signal can be made before evaluating other signals in priority order. Thus, historical information can be used to attempt to minimize on average the time delay after power-on before a signal is found. In addition, the radiotelephone can annotate the channels in the list with the elapsed time since each was last used, the time and date each was last used, or simply store them in order of most recent use. Channels used most recently may then be searched first.

Figure 6:
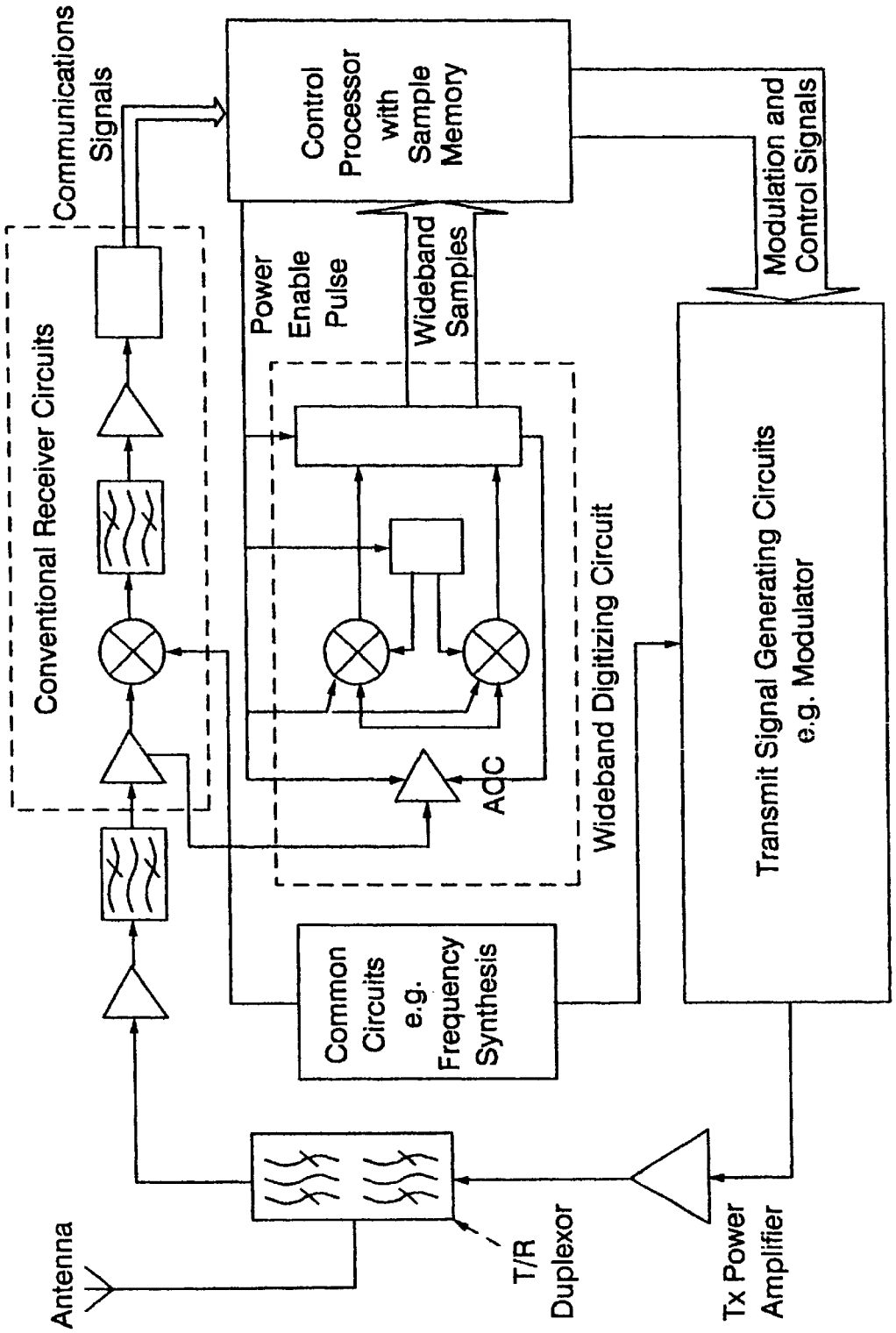

FIG. 6 is a combination of FIGS. 2 and 4 of the above-cited application Ser. No. 09/196,005. FIG. 6 illustrates a cellular radiotelephone wherein a wideband digitizing receiver periodically digitizes an entire scanned bandwidth and processes the complex signal samples to obtain energy values for each of a number of narrowband channels. A detailed description of FIG. 6 may be found in the above-cited application Ser. No. 09/196,005 and need not be repeated herein. This technique can also be applied in the present invention by, at Block 504, digitizing the signal received in the GSM bandwidth using the GSM receiver's complex vector digitizer, which can for example be the logpolar digitizer of U.S. Pat. No. 5,048,059 to the present inventor. The samples are collected at a rate that is higher than the Nyquist rate for the bandwidth, and are then submitted to a digital channelisation system such as an FFT which splits the signal into different, narrower frequency bands. The energy in each of the frequency bands is then averaged over the sampling period to obtain a signal strength measurement for each narrower channel.

This processing may be done "off line" using other signal processing resources, such as digital signal processors that are not used for tuning the receiver or for collecting or digitizing samples. Therefore, the digital signal processing of samples previously collected with the receiver tuned to one channel can take place while tuning the receiver to or collecting samples on another channel. This can allow Blocks 506, 512 and 514 to be replaced by digital signal processing samples collected in Block 504 at the same time that Block 504 continues to scan the band in large steps. Similarly, if Blocks 526–552 include complex digitization of the signal received using the GSM bandwidth and digital processing of the same to split the signal into 30 kHz frequency increments, Blocks 554–568 may be eliminated and included in the digital signal processing, thus speeding up the detection of a D-AMPS signal.

When GSM bandwidth is selected, the GSM complex sampling rate of 270.833 ks/S may also be selected. The sampling time may also be selected to be the GSM sampling time of one GSM slot of approximately 0.5 mS, giving 128 complex samples at least. If more samples are taken to allow some samples to be discarded at the beginning and end of the sampling window where transient effects may predominate, 128 valid samples are preferably collected. This number can conveniently allow a base-2 FFT to be used to determine the spectral content of the samples and thereby determine the sub-channel containing the maximum energy.

Another, potentially more efficient method will now be described for determining a 30 kHz sub-channel containing the maximum energy, based on successive trisection of the spectrum. First, every pair of adjacent samples is combined in three different ways defined by EVEN+ODD
EVEN+j.ODD
and EVEN−j.ODD
to obtain 3×64=192 combined results. Within each set of 64 results corresponding to the same method of combination, the modulus squared of the 64 complex numbers is computed and summed. The results for the combination method which gave the highest sumsquare modulus are then retained, representing a selection of one of the three frequency shifts −Fs/4, 0 or +Fs/4 where Fs is the sampling rate (270.833 kHz). The signal samples have thus been shifted in frequency by −67 kHz, 0 or +67 kHz in order to bring the region containing maximum spectral energy into the center. The number of samples has also been halved from 128 to 64 by this decimation process, which can also halve the bandwidth.

The process may be repeated on the 64 remaining samples, further trisecting the spectrum by a frequency shift of −34 kHz, 0 or +34 kHz. After this stage, it should be evident which 30 kHz subdivision of the original bandwidth contains the majority of the energy, but it is also possible to carry the frequency decimation process at least one more stage if desired. Saving the sumsquare modulus figures can also provide clues as to the location of the spectral peak and whether there is more than one peak, and also can help determine if the sampled signal was a D-AMPS or GSM signal. Probability estimates may be accumulated for each frequency channel that the channel:

a) contains no useful signal,
b) contains an AMPS analog control channel,
c) contains a D-AMPS traffic channel or DCC, or
d) contains a GSM BCCH.

When a sufficiently high probability is detected, based on a-priori historical or starting probabilities combined with the results of channel scanning, then the receiver can be launched on a full attempt to synchronize with and read data from the channel of highest probability of containing a useful signal.

One penalty of performing more digital signal processing is that the battery current may be increased during scanning. This may be offset by a more rapid signal acquisition, such that the total number of milliampere-hours used to acquire a signal is reduced, which is an advantage for battery life. There may however be occasions on which no signal is found and it may then be a disadvantage to continue to consume a high power in search mode.

The broad principles of the invention have been described above, and numerous ways in which the invention can be adapted according to the nature of the user's subscription have been pointed out. It can also be pointed out that different adaptations of the inventive scanning strategies can be preprogrammed and user selected via a menu driven display. Alternatively, different adaptations can be periodically tried by the radiotelephone and that which on average finds a channel most quickly in different signal environments can be selected as the preferred strategy when that signal environment is encountered.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A multiple-mode cellular radiotelephone, comprising:
   means for selecting one of a wide bandwidth receiving mode corresponding to a first cellular radiotelephone standard, and a narrow bandwidth receiving mode that is narrower than the wide bandwidth receiving mode, corresponding to a second cellular radiotelephone standard ; and
   means for controlling the means for selecting to select the wide bandwidth receiving mode while scanning for signals in the narrow bandwidth receiving mode.

2. A multiple-mode cellular radiotelephone according to claim 1 wherein the means for controlling further comprises:
   means for controlling the means for selecting to select the narrow bandwidth receiving mode while scanning for signals in the wide bandwidth receiving mode.

3. A multiple-mode cellular radiotelephone according to claim 1 wherein the first and second cellular radiotelephone standards comprise two of the cellular radiotelephone standards selected from AMPS, IS95 and GSM.

4. A multiple-mode cellular radiotelephone according to claim 1, further comprising:
   means for digitizing signals that are received in the wide bandwidth receiving mode while scanning for signals in the narrow bandwidth receiving mode, to obtain digitized complex signal samples of the wide bandwidth receiving mode; and
   means for processing the digitized complex signal samples to determine energy in each of a plurality of narrow bandwidths corresponding to channels in the second cellular radiotelephone standard.

5. A multiple-mode cellular radiotelephone according to claim 1:
   wherein the means for controlling further comprises means for controlling a receiver to tune to a sequence of channel frequencies in the wide bandwidth receiving mode and to make signal measurements on the sequence of channel frequencies;
   the dual-mode radiotelephone further comprising means for processing the signal measurements to select at least one channel frequency from the sequence of channel frequencies, and means for controlling the means for selecting to select the narrow bandwidth receiving mode and to scan the at least one channel frequency in the narrow bandwidth receiving mode.

6. A method of searching for control channel signals in a multiple-mode cellular radiotelephone that conforms to at least two cellular radiotelephone standards of different signal bandwidths, the searching method comprising the step of:
   selecting a receiver bandwidth conforming to a wider one of the at least two cellular radiotelephone standards of different signal bandwidths while searching for control channels that conform to a narrower one of the at least two cellular radiotelephone standards of different signal bandwidths relative to the wider one of the at least two cellular radiotelephone standards of different signal bandwidths.

7. A method according to claim 6 further comprising the step of:
   selecting a receiver bandwidth conforming to a narrower one of the at least two cellular radiotelephone standards of different signal bandwidths while searching for control channels that conform to a wider one of the at least two cellular radiotelephone standards of different signal bandwidths relative to the narrower one of the at least two cellular radiotelephone standards of different signal bandwidths.

8. A method according claim 6 wherein the at least two cellular radiotelephone standards of different signal bandwidths comprise at least two of the cellular radiotelephone standards selected from AMPS, IS95 and GSM.

9. A method according to claim 6, further comprising the steps of:

digitizing signals that are received in response to the selecting step to obtain complex signal samples; and processing the complex signal samples to determine energy in each of a plurality of narrow bandwidths corresponding to channels in the narrower one of the at least two cellular radiotelephone standards of different signal bandwidths.

10. A method according to claim 6 further comprising the steps of:

searching for control channels that conform to the narrower one of the at least two cellular radiotelephone standards of different signal bandwidths by controlling a receiver to tune to a sequence of channel frequencies in the wider one of the at least two cellular radiotelephone standards of different signal bandwidths;

making signal measurements on the sequence of channel frequencies;

processing the signal measurements to select at least one channel frequency from the sequence of channel frequencies;

selecting a receiver bandwidth conforming to the narrower one of the at least two cellular radiotelephone standards of different signal bandwidths; and scanning the at least one channel frequency using the receiver bandwidth conforming to the narrower one of the at least two cellular radiotelephone standards of different signal bandwidths.

11. A multiple-mode cellular radiotelephone that conforms to at least two cellular radiotelephone standards of different signal bandwidths, the multiple-mode cellular radiotelephone comprising:

a selector that selects a receiver bandwidth conforming to a wider one of the at least two cellular radiotelephone standards of different signal bandwidths while searching for control channels that conform to a narrower one of the at least two cellular radiotelephone standards of different signal bandwidths relative to the wider one of the at least two cellular radiotelephone standards of different signal bandwidths.

12. A multiple-mode cellular radiotelephone according to claim 11 wherein the selector also selects a receiver bandwidth conforming to a narrower one of the at least two cellular radiotelephone standards of different signal bandwidths while searching for control channels that conform to a wider one of the at least two cellular radiotelephone standards of different signal bandwidths relative to the narrower one of the at least two cellular radiotelephone standards of different signal bandwidths.

13. A multiple-mode cellular radiotelephone according to claim 11 wherein the at least two cellular radiotelephone standards of different signal bandwidths comprise at least two of the cellular radiotelephone standards selected from AMPS, IS95 and GSM.

14. A multiple-mode cellular radiotelephone according to claim 11, further comprising:

a digitizer that digitizes signals that are received in response to the selector to obtain complex signal samples; and a channelizer that processes the complex signal samples to determine energy in each of a plurality of narrow bandwidths corresponding to channels in the narrower one of the at least two cellular radiotelephone standards of different signal bandwidths.

15. A multiple-mode cellular radiotelephone according to claim 11 further comprising:

a controller that controls a receiver to tune to a sequence of channel frequencies in the wider one of the at least two cellular radiotelephone standards of different signal bandwidths and to make signal measurements on the sequence of channel frequencies to search for control channels that conform to the narrower one of the at least two cellular radiotelephone standards of different signal bandwidths; and a signal evaluator that processes the signal measurements to select at least one channel frequency from the sequence of channel frequencies for scanning after selecting the narrower one of the at least two cellular radiotelephone standards of different signal bandwidths.

* * * * *